United States Patent
Frosien (12)

(10) Patent No.: US 6,182,605 B1
(45) Date of Patent: Feb. 6, 2001

(54) APPARATUS FOR PARTICLE BEAM INDUCED MODIFICATION OF A SPECIMEN

(75) Inventor: Jurgen Frosien, Riemerling (DE)

(73) Assignee: Advantest Corp., Tokyo (JP)

( * ) Notice: Under 35 U.S.C. 154(b), the term of this patent shall be extended for 0 days.

(21) Appl. No.: 09/551,004

(22) Filed: Apr. 18, 2000

(30) Foreign Application Priority Data

Apr. 19, 1999 (EP) ................................... 99107756

(51) Int. Cl.[7] ................................................. C23G 16/452
(52) U.S. Cl. ................................ 118/723 EB; 118/723 FI
(58) Field of Search ..................... 118/723 CB, 723 FE, 118/723 FI, 723 EB; 427/523, 524, 525, 526, 527, 528, 529, 530, 531, 561, 562, 563, 564, 570, 596

(56) References Cited

U.S. PATENT DOCUMENTS 5,342,448 * 8/1994 Hamamura et al. ............ 118/723 FI
5,885,354 * 3/1999 Frosien et al. ................. 118/723 FE

* cited by examiner

Primary Examiner—Richard Bueker
Assistant Examiner—Sylvia R. MacArthur
(74) Attorney, Agent, or Firm—Muramatsu & Associates

(57) ABSTRACT

Apparatus for particle beam induced modification of a specimen, comprising a source for generating a particle beam, nozzles for supplying a gas in the region of the specimen, and electrodes which can be supplied with a variable voltage. Said electrodes are forming a tube and the nozzles, being integrated in the electrodes, are leading into the tube.

9 Claims, 2 Drawing Sheets

APPARATUS FOR PARTICLE BEAM INDUCED MODIFICATION OF A SPECIMEN

The invention relates to an apparatus for a particle beam induced modification of a specimen, comprising a source for generating a particle beam, nozzles for supplying a gas in the region of the specimen and electrodes which can be Supplied with a variable voltage.

Particle beam induced processes are well known for precise modification approaches especially in the semiconductor industry. Here, device modification is performed on a micrometre and nanometre scale for chip and mask repair and fast chip prototyping. Two basic modification techniques are applied for local processing with high spatial resolution: material etching and material deposition.

Those techniques are mainly applied in focussed ion beam systems. However equivalent techniques are also known from electron beam systems (D. Winkler et al, "E-beam probe station with integrated tool for electron beam induced etching", Microelectronic engineering 31 (1996) 141 to 147).

In such a particle beam apparatus a particle beam is generated and focussed onto a specimen to be modified. A deflection system in the particle beam system deflects the beam to or scans the beam in those areas in which the modification is to take place. Additionally, a gas is supplied in the modification area of the specimen by means or a gas nozzle, which creates a gas atmosphere in the beam interaction area of the specimen. Due to the interaction of the particle beam with the gas molecules, chemically active atoms and radicals will be generated, which can interact with the specimen in the area of the beam interaction. Basically, two processes can be performed depending on the gases supplied. The following table shows some examples of materials and corresponding modification gases:

| Material to be deposited | Applied gas |
| --- | --- |
| Gold, Au | Dimethyl-gold-trifluoro-acetylacetonate |
| Platinum, Pt | Trimethyl platinum |
| Tungsten, W | Tungsten hexacarbonyl |
| Silicon oxide | Tetramethoxysilane |
| Copper | Hexafluoro-acetyo-acetonate copper vinyl-trimethy-silane |
| Material to be etched | Etching gas |
| Silicon oxide, Silicon | Xenon-difluoride |
| Aluminium | Chlorine |
| Resist | Water |

The gas supply unit has to be placed after the final objective lens very close to the specimen in order to achieve a high-density gas atmosphere for a fast modification process. This placement of the gas supply unit next to the particle beam, however, can cause limitations regarding the beam performance. Especially in high end systems, in which high spatial resolution (fine probe size) is generated by electrical fields, the nozzle generates interferences. Since the nozzle is made of conductive material (in order to avoid charging), it distorts the electrical field and will consequently increase the probe diameter of the particle beam. This will reduce system resolution and, correspondingly, will increase the minimum feature size applicable for modification.

JP-A-01 169 858 discloses an apparatus for a particle beam induced modification of a specimen according to the preamble to claim 1. The deflecting means of this known apparatus is constituted of multiple deflecting electrodes arranged axially symmetrically with the optical axis of the charged particle beam. At least one of the deflecting electrodes is used as a gas pipe to guide the gas to the surface of the specimen.

The object of the invention is to improve the apparatus for particle beam induced modification so that it allows particle beam modification without the restriction of resolution loss due to the presence of the gas supply means.

The object is achieved by the features of claim 1 in that the electrodes are forming a tube and the nozzles, being integrated in the electrodes, are leading into the tube.

By arranging the electrodes in the form of a tube, it is possible to create a homogenous gas atmosphere within the tube which results in a more uniform material edging or material deposition.

This effect can be further improved, if the tube has a cover with an incident opening for the particle beam.

Further embodiments of the invention are the subject matter of the subordinate claims.

Further embodiments and advantages of the invention are explained in greater detail below with reference to the drawings, in which.

Figure 1:
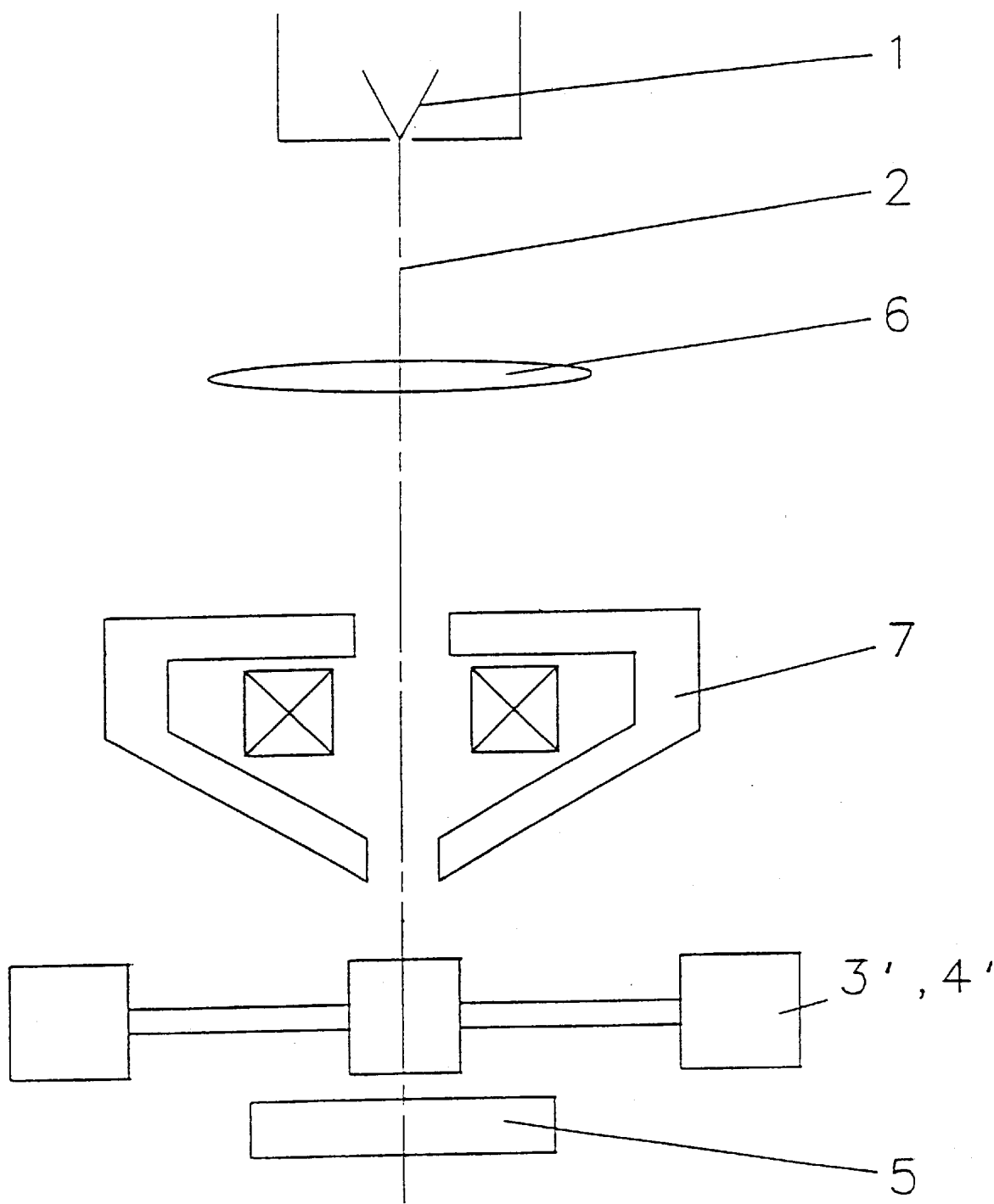
FIG. 1 shows a schematic representation of the apparatus.

FIG. 1 shows an apparatus for particle beam induced modification of a specimen comprising a source 1 for generating a particle beam 2 and a component having means 3' f or supplying a gas in the region of a specimen 5 and electrodes 4' which can be supplied with a variable voltage. Furthermore, the apparatus comprises a lens system 6 and an objective lens 7. Of course, the apparatus consists of further means which are not illustrated, such as, for instance, a deflector and a detector.

Figure 2:
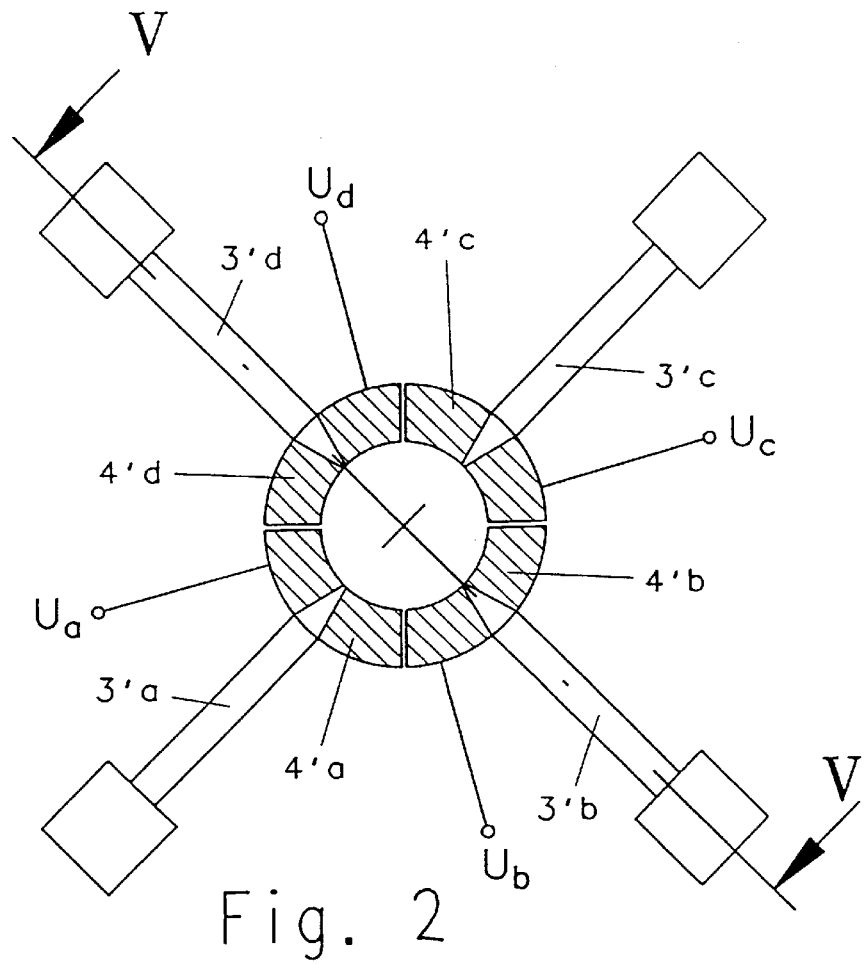
FIG. 2 shows a schematic top view of the gas supply means and the electrodes and FIG. 3 shows a sectional view along the line V—V of FIG. 2.
Figure 3:
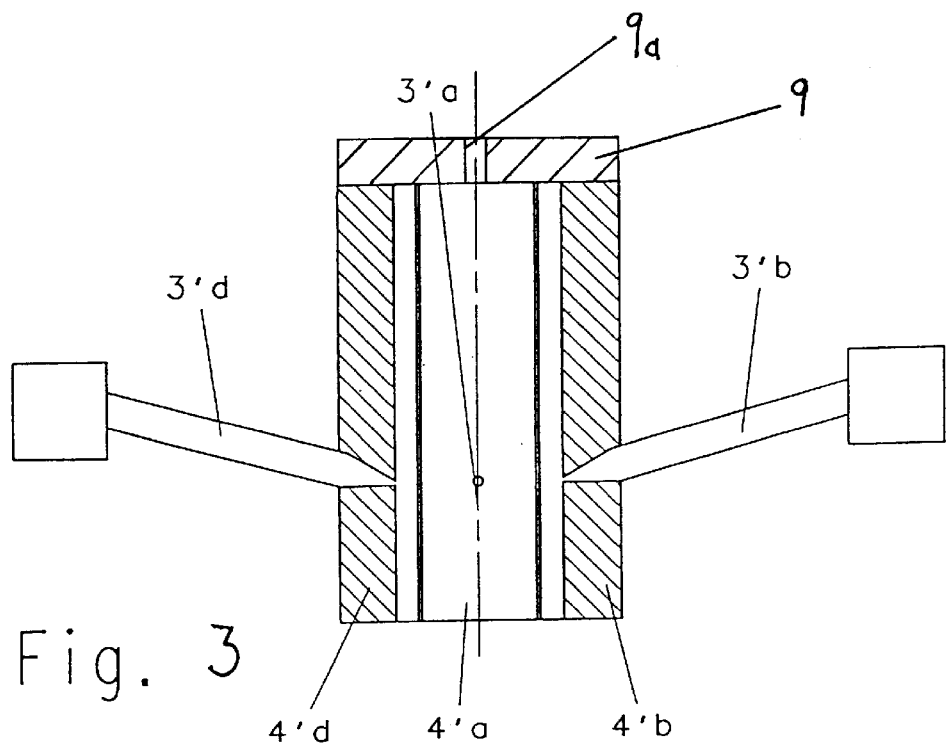

FIGS. 2 and 3 disclose the component, having means 3' for supplying a gas and having electrodes 4' which can be supplied with a variable voltage, in greater detail. The electrodes 4'a, 4'b, 4'c, 4'd are not formed by the nozzles themselves. On the contrary, the nozzles 3'a, 3'b, 3'c, 3'd are integrated in the electrodes. The electrodes are formed by parts of a tube as disclosed in FIGS. 2 and 3. Every electrode has integrated a nozzle which leads into the tube formed by all electrodes. By using all nozzles for supplying the same gas in the region of the specimen, it is possible to create a homogeneous gas atmosphere which results in a more uniform material etching or material deposition.

In order to further improve the homogenous gas atmoshpere, it is possible to close the tube with a cover 9 which has an incident opening 9a for the particle beam (cf. FIG. 3).

In FIGS. 2 and 3 the electrodes are arranged in a quadrupole configuration. However, other multipole configurations as hexapole or octupole configurations are also possible.

According to the invention it is not at all necessary that every electrode is provided with a nozzle.

The electrodes may achieve additional functions or take over functions which are performed by other optical components. Accordingly, the electrodes can be used as a deflector for the particle beam or as a stigmator or both. Furthermore, they may be adapted to generate an axial acceleration or deceleration field.

The means 3' for supplying a gas and the electrodes 4' are placed between the objective lens 7 and the specimen 5. Preferably, they should be placed close to the specimen and should have their axis on the optical axis of the particle beam apparatus. By arranging the nozzles together with the electrodes in a multipole configuration a symmetry of the means 3' for supplying the gas is created which decreases asymmetrical distortions of the particle beam. By arranging the electrodes in combination with the nozzles, it is possible to achieve additional functions or to take over functions which are performed by other optical components. This, in most cases, will reduce the working distance of the objective lens which additionally will improve the optical system performance.

What is claimed is:

1. Apparatus for particle beam induced modification of a specimen, comprising a source (1) for generating a particle beam (2)

nozzles (3'a, 3'b . . . ) for supplying a gas in the region of the specimen (5), and electrodes (4'a, 4'b . . . which can be supplied with a variable voltage, characterized in that said electrodes are forming a tube and the nozzles, being integrated in the electrodes, are leading into the tube.

2. Apparatus according to claim 1, characterised in that the electrodes (4'a, 4'b . . . ) are arranged in a multipole configuration.

3. Apparatus according to claim 2, characterised in that the multipole configuration is used as a deflector for the particle beam.

4. Apparatus according to claim 2, characterised in that the multipole configuration is used as a stigmator for the particle beam.

5. Apparatus according to claim 2, characterised in that the multipole configuration is used as a deflector and a stigmator for the particle beam.

6. Apparatus according to claim 1, characterised in that the electrodes (4'a, 4'b . . . ) are arranged and adapted to generate an axial acceleration or deceleration field.

7. Apparatus according to claim 1, characterised in that the electrodes are arranged in a quadrupole configuration.

8. Apparatus according to claim 1, characterised in that the electrodes are arranged in a hexapole configuration.

9. Apparatus according to claim 1; characterised in that the electrodes are arranged in an octupole configuration.

* * * * *